US012744363B2

(12) United States Patent
Era et al.

(10) Patent No.: US 12,744,363 B2

(45) Date of Patent: Sep. 22, 2026

(54) LASER LIGHT SOURCE DEVICE AND LASER PROCESSING APPARATUS

(71) Applicant: Panasonic Holdings Corporation, Osaka (JP)

(72) Inventors: Masanori Era, Kumamoto (JP); Masaharu Fukakusa, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 785 days.

(21) Appl. No.: 18/090,630

(22) Filed: Dec. 29, 2022

(65) Prior Publication Data

US 2023/0134268 A1 May 4, 2023

Related U.S. Application Data

(63) Continuation of application No. PCT/JP2021/024928, filed on Jul. 1, 2021.

(30) Foreign Application Priority Data

Jul. 22, 2020 (JP) ................................ 2020-125757

(51) Int. Cl.
*H01S 5/40* (2006.01)
*H01S 5/00* (2006.01)

(52) U.S. Cl.
CPC .......... *H01S 5/4012* (2013.01); *H01S 5/0071* (2013.01); *H01S 5/4025* (2013.01); *H01S 5/4062* (2013.01); *H01S 5/4087* (2013.01)

(58) Field of Classification Search
CPC .... H01S 5/4012; H01S 5/0071; H01S 5/4025; H01S 5/4062; H01S 5/4087
See application file for complete search history.

(56) References Cited

U.S. PATENT DOCUMENTS 6,529,542 B1 3/2003 Karlsen et al.
2007/0291812 A1* 12/2007 Petersen .............. H01S 5/4062 372/103

(Continued)

FOREIGN PATENT DOCUMENTS

JP 2014-120560 6/2014
JP 2016-54295 4/2016

(Continued)

OTHER PUBLICATIONS

International Search Report (ISR) issued on Sep. 21, 2021 in International (PCT) Application No. PCT/JP2021/024928.

*Primary Examiner* — Yuanda Zhang
(74) *Attorney, Agent, or Firm* — Wenderoth, Lind & Ponack, L.L.P.

(57) ABSTRACT

A laser light source device includes: a first light emitter that emits a first laser beam; a second light emitter that emits a second laser beam; an optical element that converges the first laser beam and the second laser beam; a wavelength dispersing element on which the first laser beam and the second laser beam from the optical element are incident, and which causes optical axes of the first laser beam and the second laser beam to coincide with one another, and then transmits the first laser beam and the second laser beam; and a partially reflecting mirror that returns portions of the first laser beam and the second laser beam from the wavelength dispersing element by reflection, and transmits remaining portions of the first laser beam and the second laser beam that have exited from the wavelength dispersing element. The reflectance of the partially reflecting mirror is wavelength-dependent.

6 Claims, 6 Drawing Sheets

(56) References Cited

U.S. PATENT DOCUMENTS

2016/0056608 A1* 2/2016 Kim .................... H01S 5/02438
372/20
2018/0175590 A1 6/2018 Yamamoto et al.
2020/0028332 A1* 1/2020 Kobayashi ............... G02B 3/06
2020/0176954 A1* 6/2020 Whitmore ............. H01S 5/0233

FOREIGN PATENT DOCUMENTS

JP 2016-81994 5/2016
WO 2017/022142 2/2017

* cited by examiner

LASER LIGHT SOURCE DEVICE AND LASER PROCESSING APPARATUS

CROSS REFERENCE TO RELATED APPLICATIONS

This is a continuation application of PCT International Application No. PCT/JP2021/024928 filed on Jul. 1, 2021, designating the United States of America, which is based on and claims priority of Japanese Patent Application No. 2020-125757 filed on Jul. 22, 2020. The entire disclosures of the above-identified applications, including the specifications, drawings and claims are incorporated herein by reference in their entirety.

FIELD

The present disclosure relates to a laser light source device and a laser processing apparatus.

BACKGROUND

Conventionally, a laser light source device that includes a laser element in which a plurality of light emitters are integrated is known.

For example, Patent Literature (PTL) 1 discloses a laser light source device that includes such a laser element, a fast-axis collimator, a diffraction grating, and a partially reflecting mirror in this order along an optical path. In this laser light source device, an external resonator is configured between the laser element and the partially reflecting mirror.

In such a laser light source device, a plurality of laser beams emitted from the plurality of light emitters are incident on the diffraction grating at different incident angles. The plurality of laser beams have different oscillation wavelengths in accordance with the incident angles.

CITATION LIST

Patent Literature

PTL 1: Japanese Unexamined Patent Application Publication No.

SUMMARY

Technical Problem

Optical feedback efficiency is used as an index that indicates the extent to which a plurality of laser beams that are reflected by a partially reflecting mirror return to a plurality of light emitters. In a conventional laser light source device, the diffraction efficiency of a diffraction grating varies for the plurality of laser beams because the plurality of laser beams are incident on the diffraction grating at different incident angles and have different oscillation wavelengths. Therefore, it is difficult to control the optical feedback efficiency of each of the plurality of light emitters and, for example, there is a variation in the optical feedback efficiency among the plurality of light emitters. Consequently, the oscillation stability of the plurality of laser beams decreases, for example.

The present disclosure provides a laser light source device and the like that enables the optical feedback efficiency of each of a plurality of light emitters to be controlled.

Solution to Problem

A laser light source device according to the present disclosure includes: a first light emitter that emits a first laser beam; a second light emitter that emits a second laser beam; an optical element that converges the first laser beam and the second laser beam; a wavelength dispersing element on which the first laser beam and the second laser beam that have exited from the optical element are incident, the wavelength dispersing element causing an optical axis of the first laser beam and an optical axis of the second laser beam to coincide with one another, and then transmitting the first laser beam and the second laser beam; and a partially reflecting mirror that returns a portion of the first laser beam and a portion of the second laser beam that have exited from the wavelength dispersing element by reflection, and transmits a remaining portion of the first laser beam and a remaining portion of the second laser beam that have exited from the wavelength dispersing element, wherein a reflectance of the partially reflecting mirror is wavelength-dependent.

A laser processing apparatus according to an aspect of the present disclosure includes the above-described laser light source device.

Advantageous Effects

The present disclosure can provide a laser light source device and the like that enables the optical feedback efficiency of each of a plurality of light emitters to be controlled.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, embodiments of the present disclosure will be described with reference to the Drawings. It should be noted that each of the embodiments described below shows a specific example of the present disclosure. Accordingly, the numerical values, shapes, materials, constituent elements, the arrangement and connection of the constituent elements, steps, the order of the steps, etc. shown in the following embodiments are mere examples, and therefore are not intended to limit the present disclosure.

It should be noted that the respective figures are schematic diagrams and are not necessarily precise illustrations.

Accordingly, the scaling, etc., depicted in the figures is not necessarily accurate. Additionally, in the figures, elements that are substantially the same are given the same reference signs, and overlapping descriptions thereof are omitted or simplified.

Embodiment 1

(Configuration of Laser Light Source Device)

First, the configuration of laser light source device 1 according to the present embodiment will be described with reference to FIG. 1.

Figure 1:
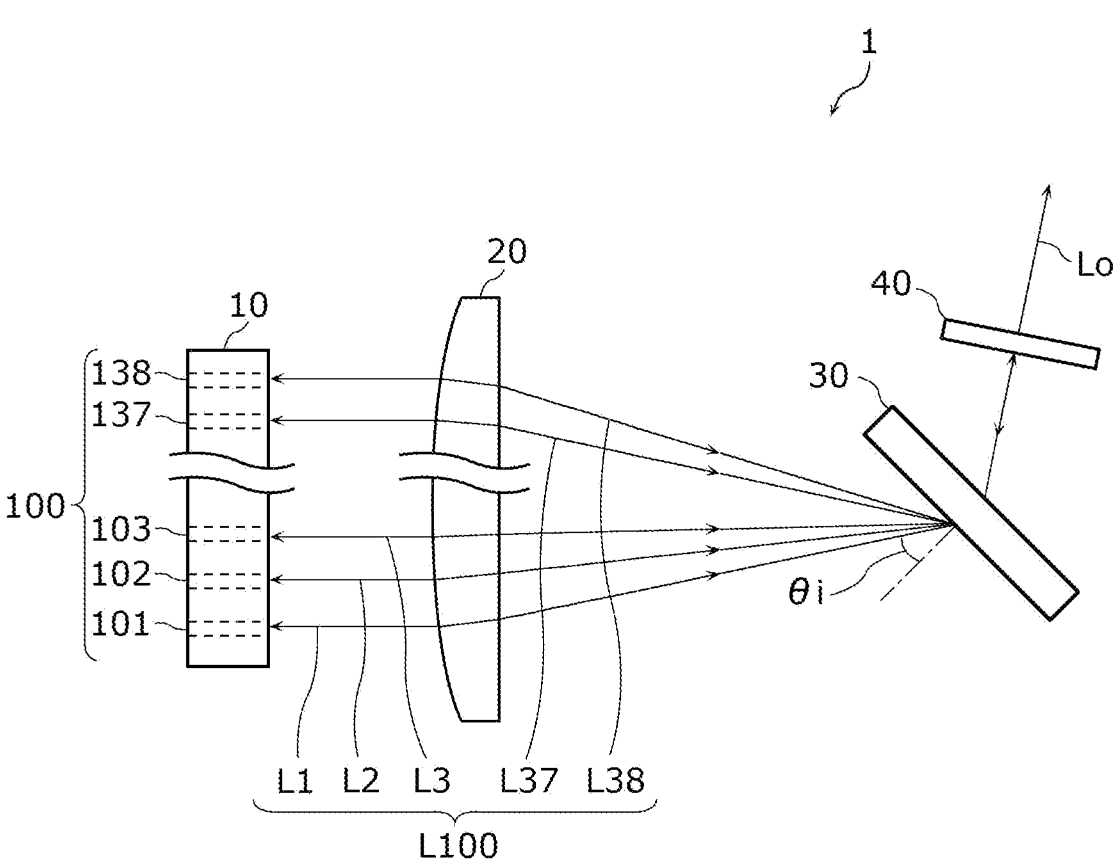
FIG. 1 is a schematic diagram illustrating the configuration of a laser light source device according to Embodiment 1.

FIG. 1 is a schematic diagram illustrating the configuration of laser light source device 1 according to the present embodiment.

As illustrated in FIG. 1, laser light source device 1 is a light emitting device that includes laser element 10, optical element 20, wavelength dispersing element 30, and partially reflecting mirror 40. Laser element 10, optical element 20, wavelength dispersing element 30, and partially reflecting mirror 40 are arranged in this order along the optical path of a plurality of laser beams L100 that are emitted from laser element 10. In FIG. 1, behavior of the plurality of laser beams L100 is indicated by arrows.

Laser light source device 1 is a light emitting device that outputs output beam Lo according to the so-called direct diode laser (DDL) system which directly uses laser beams that are emitted from laser element 10. Laser light source device 1 that uses the DDL system is characterized in that it is highly efficient because a laser beam is not converted and it enables processing using a laser beam ranging from ultraviolet to infrared by selecting the material (e.g., semiconductor material) of laser element 10.

In the present embodiment, laser light source device 1 outputs output beam Lo in the violet to blue range (i.e., having a wavelength in a range of from 380 nm to 480 nm). More specifically, output beam Lo is a light having a peak wavelength in the violet to blue range. Such laser light source device 1 is used for fine processing of a material, such as metal or resin, for example.

Next, constituent elements included in laser light source device 1 will be described.

Laser element 10 is a semiconductor laser that has a multi-emitter structure in which a plurality of light emitters 100 are integrated in a single device, and outputs the plurality of laser beams L100. Specifically, laser element 10 is a nitride-based semiconductor laser that is formed using a nitride-based semiconductor material, and outputs, for example, laser beams L100 in the violet to blue range.

The plurality of light emitters 100 are composed of 38 light emitters 100, namely, first light emitter 101 to thirty-eighth light emitter 138. Here, light emitters 100 are described when first light emitter 101 to thirty-eighth light emitter 138 do not need to be distinguished. It should be noted that the plurality of light emitters 100 may be composed of more or less than 38 light emitters 100.

As illustrated in FIG. 1, laser element 10 is a laser bar that is elongated in one direction.

Laser element 10 includes a substrate, a nitride-based semiconductor laser layer structure, a p-side electrode, and an n-side electrode (all of them are not illustrated in FIG. 1).

The substrate includes a first main face and a second main face. The second main face is a face on the reverse side of the first main face and is disposed back-to-back with the first main face. In the present embodiment, the first main face is a face on the p-side which serves as a front face and the second main face is a face on the n-side which serves as a back face.

For example, a semiconductor substrate such as a nitride semiconductor substrate is used as the substrate. In the present embodiment, an n-type GaN substrate having a hexagonal crystal structure is used as the substrate.

The nitride-based semiconductor laser layer structure is a nitride semiconductor laminate in which a plurality of nitride semiconductor layers each of which is formed using a nitride-based semiconductor material are laminated. The nitride-based semiconductor laser layer structure is formed above the first main face of the substrate. For example, the nitride-based semiconductor laser layer structure includes an n-type cladding layer, an active layer, a p-type cladding layer, and a p-type contact layer that are laminated in this order on the first main face of the substrate. It should be noted that, in the present embodiment, the n-type cladding layer consists essentially of n-type AlGaN, the active layer consists essentially of undoped InGaN, the p-type cladding layer consists essentially of p-type AlGaN, and the p-type contact layer consists essentially of p-type GaN.

It should be noted that, aside from the above-described nitride semiconductor layers, the nitride-based semiconductor laser layer structure may include other nitride semiconductor layers, such as an optical guide layer and an overflow suppressing layer. Additionally, an insulating film that includes an opening at a position corresponding to the p-type contact layer may be formed on the surface of the nitride-based semiconductor laser layer structure.

The nitride-based semiconductor laser layer structure includes a plurality of waveguides that are elongated in a direction orthogonal to the one direction which is the direction in which the laser bar is elongated. Each of the plurality of waveguides has functions of a current injection region and an optical waveguide in laser element 10. These waveguides correspond to light emitters 100 according to the present embodiment. The plurality of waveguides that correspond to the plurality of light emitters 100 are parallel to one another and formed at a predetermined pitch in the one direction.

The plurality of waveguides are formed on the p-type cladding layer in the nitride-based semiconductor laser layer structure, for example. As an example, the plurality of waveguides have a ridge-stripe structure and are formed as a plurality of ridges on the p-type cladding layer. In this case, the p-type contact layer may be a plurality of semiconductor layers formed individually on each of the plurality of ridges, or may be a single semiconductor layer which is continuously formed to cover the plurality of ridges.

The plurality of light emitters 100 that correspond to the plurality of waveguides each emit a laser beam. Specifically, first light emitter 101 emits first laser beam L1 and second light emitter 102 emits second laser beam L2. Similarly, third light emitter 103 to thirty-eighth light emitter 138 emit third laser beam L3 to thirty-eighth laser beam L38, respectively. Here, laser beams L100 are described when first laser beam L1 to thirty-eighth laser beam L38 do not need to be distinguished.

The p-side electrode is formed above and in contact with the nitride-based semiconductor laser layer structure. The p-side electrode includes, for example, Ti, Pt, and Au. The p-side electrode is formed above and in contact with the p-type contact layer of the nitride-based semiconductor laser layer structure, for example. A plurality of p-side electrodes are formed corresponding to the plurality of waveguides (ridges). Specifically, the p-side electrode is formed divided into multiple p-side electrodes. It should be noted that the p-side electrode need not be divided into multiple p-side electrodes. For example, the p-side electrode may be a single electrode shared among the plurality of waveguides.

The n-side electrode is formed on the second main face of the substrate. The n-side electrode includes, for example, Ti, Pt, and Au. In the present embodiment, a plurality of n-side electrodes are formed corresponding to the plurality of waveguides (ridges). Specifically, the n-side electrode is formed divided into multiple n-side electrodes. It should be noted that the n-side electrode need not be divided into multiple n-side electrodes. For example, the n-side electrode may be a single electrode shared among the plurality of waveguides.

Furthermore, the plurality of light emitters 100 emit the plurality of laser beams L100 from one end face side of laser element 10 in a transverse direction. Specifically, the one end face is a light emission face. Furthermore, the face on the reverse side of the light emission face, that is, the face disposed back-to-back with the light emission face serves as a back end face of laser element 10. The back end face is covered with an end face coating film as a reflecting film.

Furthermore, although not illustrated in the Drawings, a submount on which laser element 10 is mounted is provided. The submount includes a substrate body and an electrode layer that is laminated on the upper face of the substrate body.

The substrate body may be formed using a material with a high thermal conductivity and a small thermal expansion coefficient. For example, an SiC ceramic, an AlN ceramic, a semi-insulating SiC crystal, or a synthetic diamond may be used as the material for substrate body 211. Furthermore, a metal material, such as a Cu—W alloy or a Cu—Mo alloy, may be used as the substrate body. The electrode layer includes, for example, Ti, Pt, and Au in this order from the substrate body side.

Furthermore, laser element 10 is mounted on the submount via a bonding layer. In the present embodiment, laser element 10 is electrically connected with the electrode layer of the submount. Accordingly, a metal bonding material, such as an AuSn solder, is used as the bonding layer, for example.

The plurality of laser beams L100 emitted from the plurality of light emitters 100 of laser element 10 thus configured are incident on optical element 20.

Optical element 20 is an optical component that converges the plurality of laser beams L100 emitted from the plurality of light emitters 100. Optical element 20 is, for example, a converging lens made of glass, transparent resin, or the like. A reflection preventive coating film for preventing reflection of the plurality of laser beams L100 may be provided on the surface of optical element 20. Optical element 20 is, for example, a plano-convex converging lens in which the face facing the plurality of light emitters 100 is convex and the face facing wavelength dispersing element 30 (described later) is planar.

As illustrated in FIG. 1, the plurality of laser beams L100 emitted from the plurality of light emitters 100 are parallel to one another. Since optical element 20 is a plano-convex converging lens, it can receive the plurality of parallel laser beams L100, and then transmit the plurality of laser beams L100 so as to converge the plurality of laser beams L100 toward wavelength dispersing element 30.

It should be noted that optical element 20 is not limited to this. Optical element 20 may be, for example, a plano-convex converging lens in which the face facing the plurality of light emitters 100 is planar and the face facing wavelength dispersing element 30 is convex. Optical element 20 may be a cylindrical lens elongated in the direction in which laser element 10, which is a laser bar, is elongated. Furthermore, although single optical element 20 is provided in the present embodiment, a plurality of optical elements of mutually different shapes may be provided. When a plurality of optical elements are to be provided, an optical element that converges the plurality of laser beams L100 along the fast axis and an optical element that converges the plurality of laser beams L100 along the slow axis may be provided. Furthermore, optical element 20 may be a beam twister element. When optical element 20 is a beam twister element, optical element 20 has the effect of rotating the fast-axis and the slow-axis of the plurality of laser beams L100 by 90°.

In any case, optical element 20 converges the plurality of laser beams L100. The plurality of laser beams L100 converged by optical element 20 are directed to wavelength dispersing element 30.

Wavelength dispersing element 30 is an optical component that causes the optical axes of the plurality of laser beams L100 that have exited from optical element 20 and are incident on wavelength dispersing element 30 coincide with one another, and then transmits the plurality of laser beams L100 toward partially reflecting mirror 40 (described later). In the present embodiment, the plurality of laser beams L100 converged by optical element 20 are incident on one point on the surface of wavelength dispersing element 30. Wavelength dispersing element 30 is, for example, a diffraction grating that diffracts each of the plurality of laser beams L100. More specifically, wavelength dispersing element 30 according to the present embodiment is a blazed diffraction grating; however, wavelength dispersing element 30 is not limited to this and may be a prism or the like, for example.

In the present embodiment, the plurality of laser beams L100 that have exited from optical element 20 are converged by optical element 20 so as to be incident on one point on the surface of wavelength dispersing element 30. Here, as illustrated in FIG. 1, the plurality of laser beams L100 are incident on wavelength dispersing element 30 at different incident angles $\theta i$. Here, i denotes an integer from 1 to 38, which are numbers corresponding to 38 light emitters 100. For example, first laser beam L1 emitted from first light emitter 101 is incident on wavelength dispersing element 30 at incident angle $\theta 1$.

The plurality of laser beams L100 emitted from the plurality of light emitters 100 are diffracted by wavelength dispersing element 30, and then transmitted through wavelength dispersing element 30 and directed as diffracted beams to partially reflecting mirror 40. Specifically, in the present embodiment, wavelength dispersing element 30 is a transmissive diffraction grating. It should be noted that wavelength dispersing element 30 may be a reflective diffraction grating.

Furthermore, as illustrated in FIG. 1, wavelength dispersing element 30 causes the optical axes of the diffracted beams of the plurality of laser beams L100 coincide with one another, that is, combines the diffracted beams with one another, and then transmits the diffracted beams toward partially reflecting mirror 40.

Partially reflecting mirror 40 is an optical component that reflects a portion of the plurality of laser beams L100 that have exited from wavelength dispersing element 30, and transmits the remaining portion of the plurality of laser beams L100 that have exited from dispersing element 30. The reflectance of partially reflecting mirror 40 is wavelength-dependent. For example, the reflectance of partially reflecting mirror 40 is wavelength-dependent for the wavelength range of output beam Lo (i.e., the violet to blue range). In the present embodiment, the reflectance of partially reflecting mirror 40 for the wavelength range of output beam Lo is 5% to 25%. Specifically, partially reflecting mirror 40 is an optical component that reflects a portion of first laser beam L1 in accordance with the reflectance and transmits the non-reflected portion of first laser beam L1 (i.e., the remaining portion of first laser beam L1), for example.

It should be noted that the reflectance range of partially reflecting mirror 40 is not limited to the above-described range. Furthermore, the wavelength range for which the reflectance of partially reflecting mirror 40 is wavelength-dependent is not limited to the above-described wavelength range.

Partially reflecting mirror 40 is composed of a dichroic mirror or the like. More specifically, partially reflecting mirror 40 includes a transparent substrate made of glass, transparent resin, or the like, and a dichroic layer that includes a multilayer film of a dielectric provided on the surface of the transparent substrate.

By controlling the configuration of the multilayer film and/or the material of the dielectric included in the dichroic layer, partially reflecting mirror 40 can be made to have a predetermined reflectance for a predetermined wavelength. Accordingly, the reflectance of partially reflecting mirror 40 can be wavelength-dependent for the wavelength range of output beam Lo.

Furthermore, as described above, the plurality of laser beams L100 having optical axes that have been made to coincide with one another are incident on partially reflecting mirror 40.

The remaining portion of the plurality of laser beams L100 that have exited from partially reflecting mirror 40 is outputted as output beam Lo. On the other hand, the portion of the plurality of laser beams L100 that has been reflected by partially reflecting mirror 40 is again incident on wavelength dispersing element 30. The plurality of laser beams L100 having optical axes that have been made to coincide with one another are separated on a wavelength basis by wavelength dispersing element 30. Wavelength dispersing element 30 transmits the plurality of laser beams L100 that have been separated on a wavelength basis toward optical element 20. Furthermore, optical element 20 transmits the plurality of laser beams L100 that have been separated on a wavelength basis toward the plurality of light emitters 100. Specifically, a portion of the plurality of laser beams L100 emitted from the plurality of light emitters 100 are reflected and returned by partially reflecting mirror 40 to the plurality of light emitters 100. Furthermore, the plurality of laser beams L100 that have returned to the plurality of light emitters 100 are reflected by the end face coating film provided on the back end face of laser element 10 and directed toward optical element 20.

As described above, in the present embodiment, an external resonator is configured between the back end face of laser element 10 and partially reflecting mirror 40. In short, laser element 10 is an external cavity laser diode (ECLD).

As described above, in such laser light source device 1, the plurality of laser beams L100 emitted from the plurality of light emitters 100 are incident on wavelength dispersing element 30 at different incident angles θi. Since the resonator length of each of the plurality of laser beams L100 differs in accordance with incident angles θi, the plurality of laser beams L100 have different oscillation wavelengths. Therefore, in the present embodiment, wavelength dispersing element 30 can be described as an optical component that performs wavelength-multiplexing. It should be noted that, in wavelength dispersing element 30 which is a diffraction grating, the diffraction grating shape, such as blaze angle and pitch of diffraction grooves, is determined so that a sufficiently greater proportion of the diffracted beams that have exited from wavelength dispersing element 30 are directed toward partially reflecting mirror 40 than other direction.

(Behavior of Returning Beams)

Here, out of the plurality of laser beams L100 that have been emitted from the plurality of light emitters 100, laser beams that are reflected and returned by partially reflecting mirror 40 to the plurality of light emitters 100 (hereinafter, referred to as returning beams) will be described with reference to a laser light source device according to a comparative example.

The laser light source device according to the comparative example includes the same constituent elements as laser light source device 1 according to the present embodiment, except for one point described below. Specifically, the one point is that the reflectance of a partially reflecting mirror included in the laser light source device according to the comparative example is not wavelength-dependent but a constant value (e.g., 10%) for the wavelength range of output beam Lo.

Figure 2:
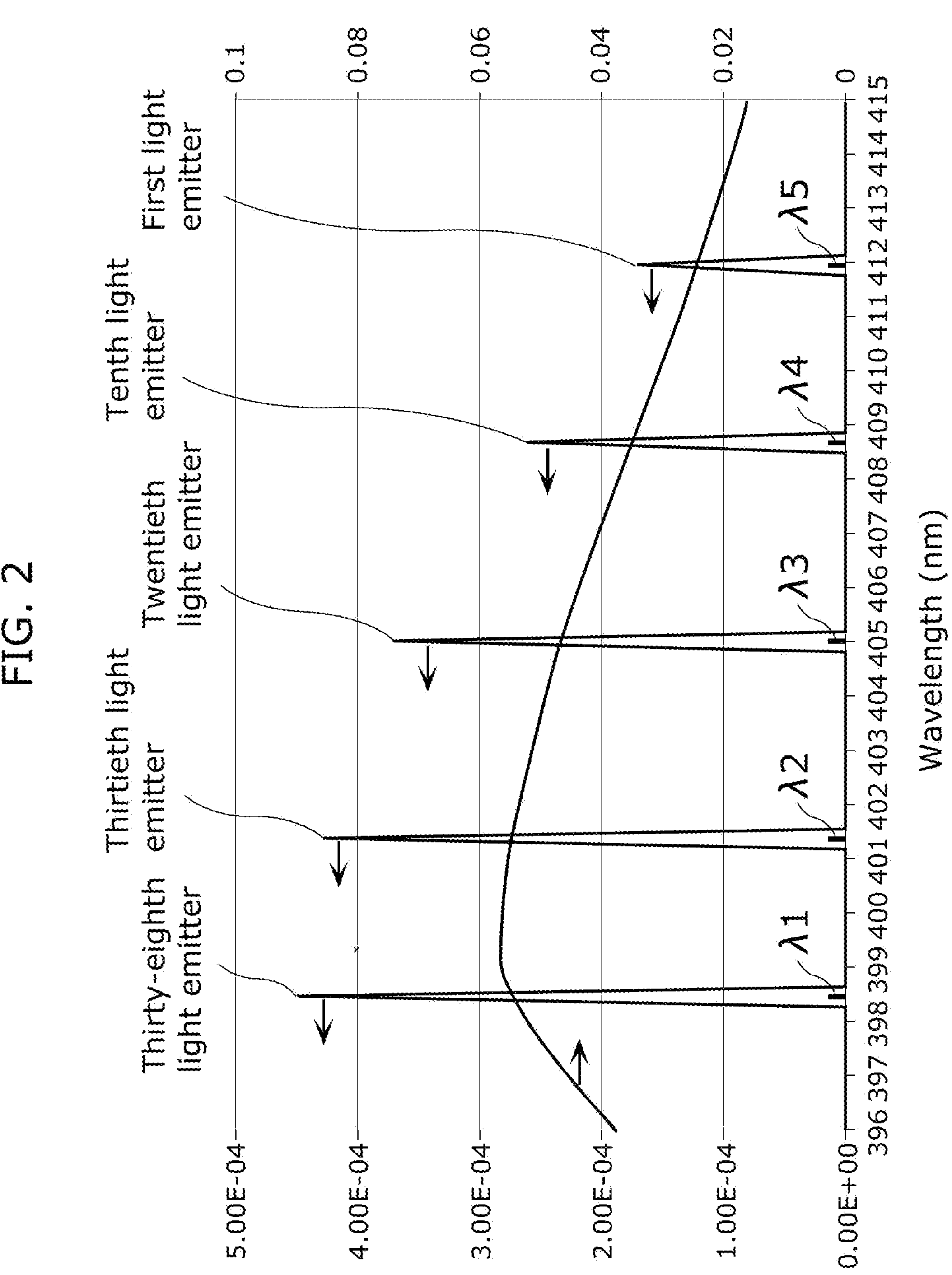
FIG. 2 is a graph showing a simulation result of external optical feedback amplitude and ASE amplitude of a plurality of laser beams of a laser light source device according to a comparative example.

Subsequently, the result of simulation performed for the laser light source device according to the comparative example will be described. FIG. 2 is a graph showing a simulation result of external optical feedback amplitude and amplified spontaneous emission (ASE) amplitude of the plurality of laser beams of the laser light source device according to the comparative example. It should be noted that, in FIG. 2, the horizontal axis represents wavelength of laser beam, the five sharp peaks represent external optical feedback amplitude, and the curved line represents ASE amplitude.

The simulation result illustrated in FIG. 2 is used for predicting the behavior of the plurality of laser beams in the laser light source device according to the comparative example.

Here, amplified spontaneous emission (ASE) amplitude in FIG. 2 is an index that indicates laser gain (i.e., ease of amplification) in the plurality of light emitters. Furthermore, external optical feedback amplitude in FIG. 2 is a value calculated from ASE amplitude, and is an index that indicates the optical feedback efficiency of each of the plurality of light emitters. It should be noted that the optical feedback efficiency of the light emitter indicates the extent to which returning beam returns to the light emitter. As the optical feedback efficiency of the light emitter becomes higher, more of the laser beam returns to the light emitter as a returning beam.

Furthermore, λ5, λ4, λ3, λ2, and λ1 in FIG. 2 denote the peak wavelength (hereinafter, referred to as oscillation peak wavelength) of the oscillation wavelength of a first laser beam, a tenth laser beam, a twentieth laser beam, a thirtieth laser beam, and a thirty-eighth laser beam, respectively, in the comparative example.

The simulation result of external optical feedback amplitude in FIG. 2 shows that, in the comparative example, the optical feedback efficiency becomes higher in the order of a first light emitter, a tenth light emitter, a twentieth light emitter, a thirtieth light emitter, and a thirty-eighth light emitter. In other words, in the laser light source device according to the comparative example, there is a variation in the optical feedback efficiency among the plurality of light emitters. This variation is caused by the influence of the diffraction efficiency of a wavelength dispersing element and the influence of adjacent laser beams.

First, the influence of the diffraction efficiency will be described.

Diffraction efficiency is a value that is obtained by dividing the energy of diffracted beams by the energy of incident beams. Specifically, out of the laser beams incident on the wavelength dispersing element, the proportion of the laser beams that exit as diffracted beams from the wavelength dispersing element increases as the diffraction efficiency becomes higher.

The diffraction efficiency is a value that varies depending on the incident angles and the oscillation wavelengths of the plurality of laser beams. In the comparative example, since the incident angles and the oscillation wavelengths of the plurality of laser beams are different, the diffraction efficiency varies for the plurality of laser beams. In other words, there is a variation in the diffraction efficiency for the plurality of laser beams.

Furthermore, as an example, in the comparative example, out of the laser beams that exit from an optical element and are incident on the wavelength dispersing element, the proportion of laser beams that are multiplexed and directed toward the partially reflecting mirror decreases as the diffraction efficiency becomes lower. In other words, as the diffraction efficiency becomes lower, more of the laser beams exhibit behavior different from the behavior of the plurality of laser beams L100 indicated by the arrows in FIG. 1. The laser beams that exhibit such a different behavior do not return to the plurality of light emitters after being emitted from the plurality of light emitters, and thus the optical feedback efficiency of each of the plurality of light emitters decreases. It should be noted that as the diffraction efficiency becomes higher, a phenomenon that is opposite to the above-described phenomenon occurs to a greater extent.

In other words, in the comparative example, since the diffraction efficiency is dependent on the incident angle and the oscillation wavelength, there is a variation in the diffraction efficiency for the plurality of laser beams. Consequently, there is a variation in the optical feedback efficiency among the plurality of light emitters.

Next, the influence of adjacent laser beams will be described.

The first laser beam that is emitted from the first light emitter and a second laser beam that is emitted from a second light emitter are exemplified as the adjacent laser beams. The first laser beam and the second laser beam influence each other in the optical element. For example, the second laser beam influences the first laser beam when the second laser beam leaks into the optical path of the first laser beam. Similarly, the first laser beam influences the second laser beam when the first laser beam leaks into the optical path of the second laser beam. Due to such influence, the optical feedback efficiency of each of the first light emitter that emits the first laser beam and the second light emitter that emits the second laser beam changes. Accordingly, there is a variation in the optical feedback efficiency among the plurality of light emitters including the first light emitter and the second light emitter.

Because there is a variation in the optical feedback efficiency in the laser light source device according to the comparative example, the oscillation stability of the plurality of laser beams decreases, for example. Furthermore, in laser light source device 1 according to the present embodiment, the optical feedback efficiency is similarly influenced by the diffraction efficiency of wavelength dispersing element 30 and the plurality of adjacent laser beams L100.

However, unlike the partially reflecting mirror according to the comparative example, partially reflecting mirror 40 of laser light source device 1 according to the present embodiment is wavelength-dependent. Hereinafter, an advantageous effect of partially reflecting mirror 40 that is wavelength-dependent will be described.

Figure 3:
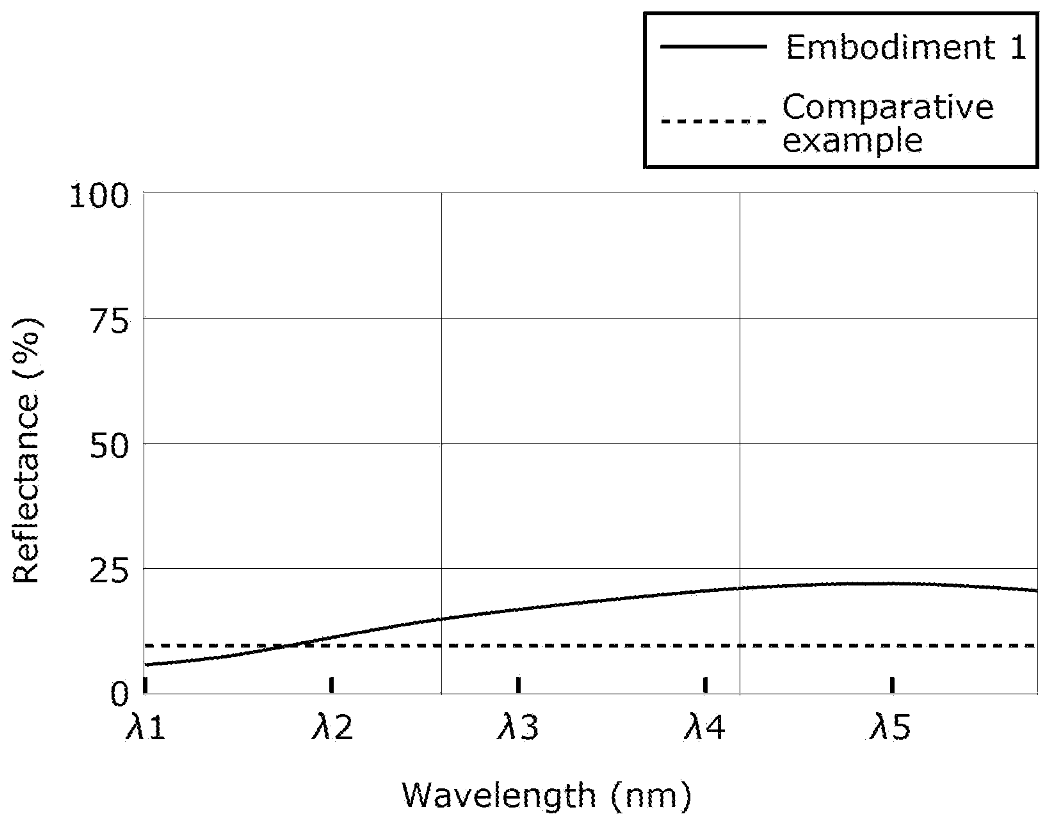
FIG. 3 is a graph showing a reflection spectrum of a partially reflecting mirror according to Embodiment 1 and a reflection spectrum of a partially reflecting mirror according to the comparative example.

FIG. 3 is a graph showing a reflection spectrum of partially reflecting mirror 40 according to the present embodiment and a reflection spectrum of the partially reflecting mirror according to the comparative example. In FIG. 3, the solid line represents the reflectance of partially reflecting mirror 40 according to the present embodiment and the broken line represents the reflectance of the partially reflecting mirror according to the comparative example.

As described above, the reflectance of partially reflecting mirror 40 according to the present embodiment is wavelength-dependent and the reflectance of the partially reflecting mirror according to the comparative example is not wavelength-dependent but a constant value (10%). It should be noted that λ5, λ4, λ3, λ2, and λ1 in FIG. 3 denote the oscillation peak wavelength of the first laser beam, the tenth laser beam, the twentieth laser beam, the thirtieth laser beam, and the thirty-eighth laser beam, respectively, in the present embodiment and the comparative example.

Here, since more of laser beam L100 having an oscillation peak wavelength in a predetermined wavelength range is reflected as the reflectance for the predetermined wavelength range becomes higher, the optical feedback efficiency of light emitter 100 that emits such laser beam L100 is enhanced. Since the reflectance of partially reflecting mirror 40 is wavelength-dependent, the optical feedback efficiency of each of the plurality of light emitters 100 can be controlled by controlling the reflectance for the predetermined wavelength range.

Furthermore, in the present embodiment, the reflectance of partially reflecting mirror 40 has a wavelength-dependency that equalizes the optical feedback efficiency of the plurality of light emitters 100. For example, the reflectance of partially reflecting mirror 40 is determined based on the optical feedback efficiency of the light emitters under the condition that the reflectance of the partially reflecting mirror is assumed to be constant as in the comparative example.

The reflectance of partially reflecting mirror 40 for a wavelength range including the oscillation peak wavelength of the laser beam emitted from a predetermined light emitter is determined so that the reflectance becomes higher as the optical feedback efficiency of the predetermined light emitter under the above-described condition becomes lower. In other words, the optical feedback efficiency of the predetermined light emitter under the above-described condition and the reflectance of partially reflecting mirror 40 for the above-described wavelength range have a negative correlation.

Specifically, as illustrated in FIG. 2, the optical feedback efficiency of the light emitters under the above-described condition (i.e., in the comparative example) becomes lower in the order of the light emitters that emit laser beams having oscillation peak wavelengths of λ1, λ2, λ3, λ4, and λ5. Correspondingly, as illustrated in FIG. 3, the reflectance of partially reflecting mirror 40 becomes higher in the order of a wavelength range including λ1, a wavelength range including λ2, a wavelength range including λ3, a wavelength range including λ4, and a wavelength range including λ5. Since the optical feedback efficiency of each of the plurality of light emitters 100 rises in accordance with the rise of the reflectance of partially reflecting mirror 40, the plurality of light emitters 100 tend to have the same optical feedback efficiency.

Specifically, in the present embodiment, since the reflectance of partially reflecting mirror 40 has the above-described characteristics, laser light source device 1 in which the plurality of light emitters 100 have the same optical feedback efficiency compared to the comparative example, for example, is realized. Furthermore, since partially reflecting mirror 40 has the above-described reflectance, it can be said that the optical feedback efficiency of each of the plurality of light emitters 100 is adjusted so that the variation in the optical feedback efficiency among the plurality of light emitters 100 is reduced compared to the comparative example. Consequently, decrease in the oscillation stability of the plurality of laser beams L100 is suppressed.

It should be noted that 'the same optical feedback efficiency' does not only mean completely identical optical feedback efficiency. For example, when the optical feedback efficiency of each of the plurality of light emitters 100 falls within the range of 90% to 110% of the average value that is calculated from the optical feedback efficiency of the plurality of light emitters 100, the plurality of light emitters 100 can be considered to have the same optical feedback efficiency.

Furthermore, in the present embodiment, wavelength dispersing element 30 is a diffraction grating.

Accordingly, since wavelength dispersing element 30 has higher diffraction efficiency, the optical utilization efficiency of laser light source device 1 can be enhanced.

Furthermore, in the present embodiment, laser light source device 1 includes laser element 10 including the plurality of light emitters 100 (e.g., first light emitter 101 and second light emitter 102).

Accordingly, in laser light source device 1 that includes laser element 10 having a multi-emitter structure, the optical feedback efficiency of the plurality of light emitters 100 can be made the same.

It should be noted that the reflectance of partially reflecting mirror 40 is preferably 3% to 50%, and more preferably 5% to 40%, and even more preferably 8% to 30%. As the reflectance becomes higher, the optical feedback efficiency can be further enhanced. Furthermore, since output beam Lo increases as the reflectance becomes lower (i.e., as the transmittance becomes higher), the optical utilization efficiency of laser light source device 1 is enhanced.

Here, a laser processing apparatus, which is an application example of laser light source device 1, will be described with reference to FIG. 4.

Figure 4:
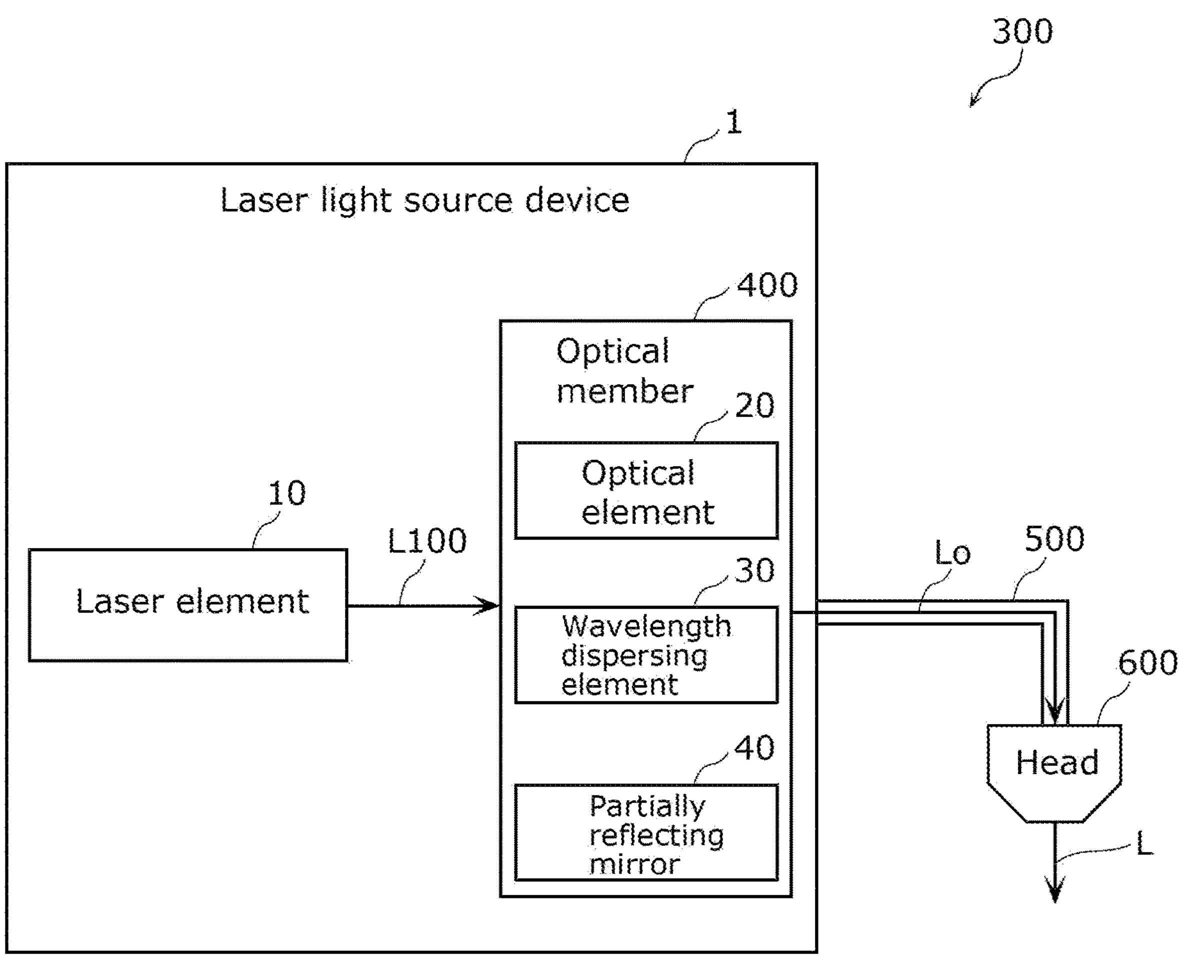
FIG. 4 is a schematic diagram illustrating a laser processing apparatus according to Embodiment 1.

FIG. 4 is a schematic diagram illustrating laser processing apparatus 300 according to the present embodiment. Laser processing apparatus 300 includes laser light source device 1, optical path 500, and head 600.

Although the configuration of laser light source device 1 is as described above, optical element 20, wavelength dispersing element 30, and partially reflecting mirror 40 are illustrated comprehensively as optical member 400 in FIG. 4 for the sake of simplicity.

Optical path 500 is an optical component that receives output beam Lo outputted from laser light source device 1 and outputs output beam Lo to head 600. Optical path 500 includes an optical component, such as an optical fiber or a reflecting mirror.

Head 600 is an optical component that outputs output beam Lo that has been outputted from laser light source device 1 via optical path 500, as a processing beam L of laser processing apparatus 300. It is sufficient that head 600 includes an optical element such as a lens having a light-converging function.

Laser processing apparatus 300 that has such a configuration can irradiate an object being processed with the plurality of laser beams L100 that exit from laser element 10, directly and with high optical density. Furthermore, since the plurality of laser beams L100 that exit from laser element 10 can be used directly, the wavelength of a laser beam to be utilized can be easily changed by changing laser element 10. Accordingly, since the wavelength can be selected according to the light absorbance of the object to be processed, the efficiency of processing, such as welding or cutting, can be enhanced.

Embodiment 2

Figure 5:
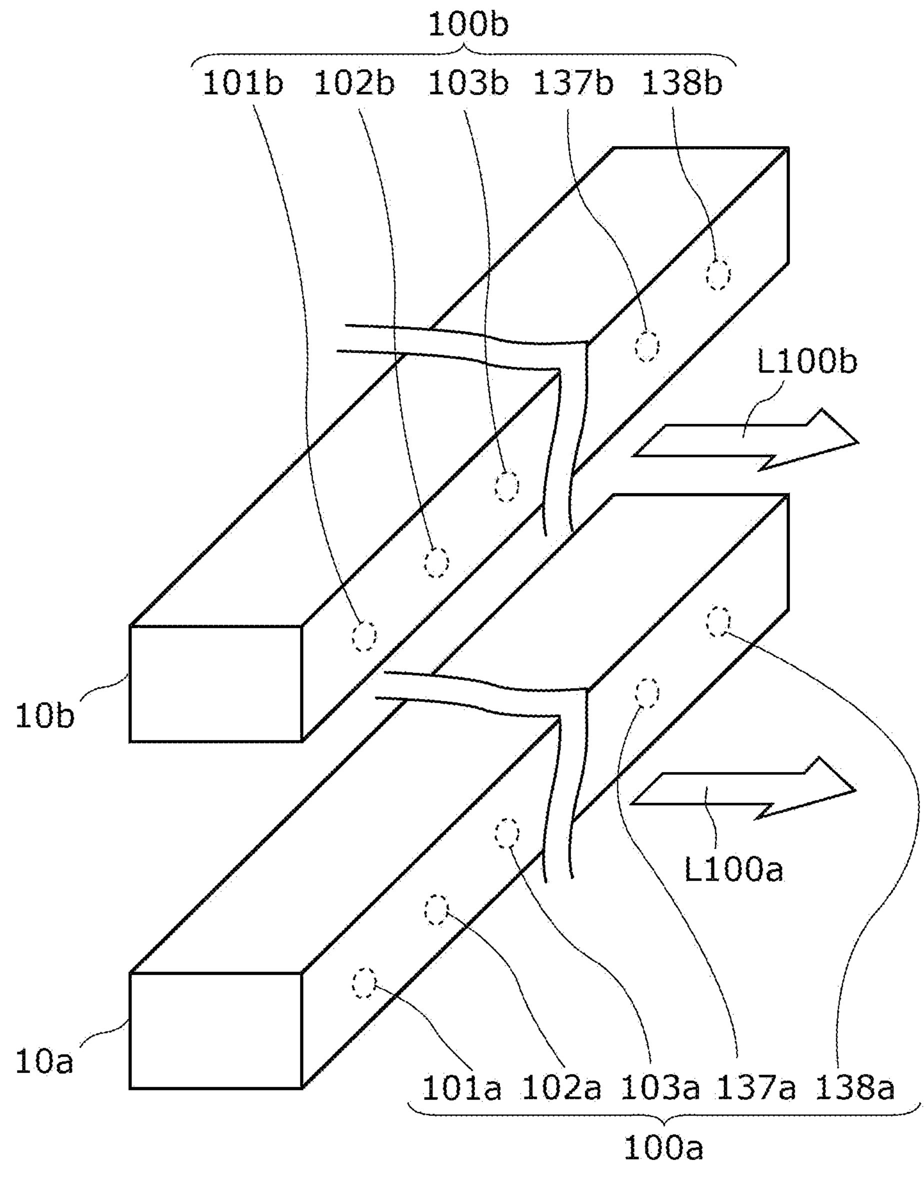
FIG. 5 is a perspective view illustrating the configuration of a plurality of laser elements included in a laser light source device according to Embodiment 2.

Next, a laser light source device according to Embodiment 2 will be described with reference to FIG. 5. FIG. 5 is a perspective view illustrating the configuration of a plurality of laser elements included in the laser light source device according to the present embodiment.

The present embodiment differs from Embodiment 1 in that a plurality of laser elements are provided in the present embodiment.

Specifically, the laser light source device according to the present embodiment has the same configuration as laser light source device 1 according to Embodiment 1, except that laser element 10*a* and laser element 10*b* are provided as the plurality of laser elements.

It should be noted that each of laser element 10*a* and laser element 10*b* has the same configuration as laser element 10 according to Embodiment 1.

Laser element 10*a* includes a plurality of light emitters 100*a* that are composed of 38 light emitters 100*a*, namely, first light emitter 101*a* to thirty-eighth light emitter 138*a*. Furthermore, each of the plurality of light emitters 100*a* emits a laser beam. Here, laser beams emitted from the plurality of light emitters 100*a* are comprehensively referred to as a plurality of laser beams L100*a*.

Similarly, laser element 10*b* includes a plurality of light emitters 100*b* that are composed of 38 light emitters 100*b*, namely, first light emitter 101*b* to thirty-eighth light emitter 138*b*. Furthermore, each of the plurality of light emitters 100*b* emits a laser beam. Here, laser beams emitted from the plurality of light emitters 100*b* are comprehensively referred to as a plurality of laser beams L100*b*.

The reflectance of a partially reflecting mirror according to the present embodiment has a wavelength-dependency that equalizes the optical feedback efficiency of the plurality of light emitters 100*a* and of the plurality of light emitters 100*b*.

In other words, the reflectance of the partially reflecting mirror according to the present embodiment has a wavelength-dependency that equalizes the optical feedback efficiency of the total 76 light emitters of first light emitter 101*a* to thirty-eighth light emitter 138*a* and first light emitter 101*b* to thirty-eighth light emitter 138*b*. As an example, the reflectance of the partially reflecting mirror according to the present embodiment has a wavelength-dependency that equalizes the optical feedback efficiency of first light emitter 101*a* and of second light emitter 102*b*.

In this case as well, a laser light source device in which the plurality of light emitters 100*a* and the plurality of light emitters 100*b* have the same optical feedback efficiency is realized, and decrease in the oscillation stability of the plurality of laser beams L100*a* and the plurality of laser beams L100*b* is suppressed.

Embodiment 3

Figure 6:
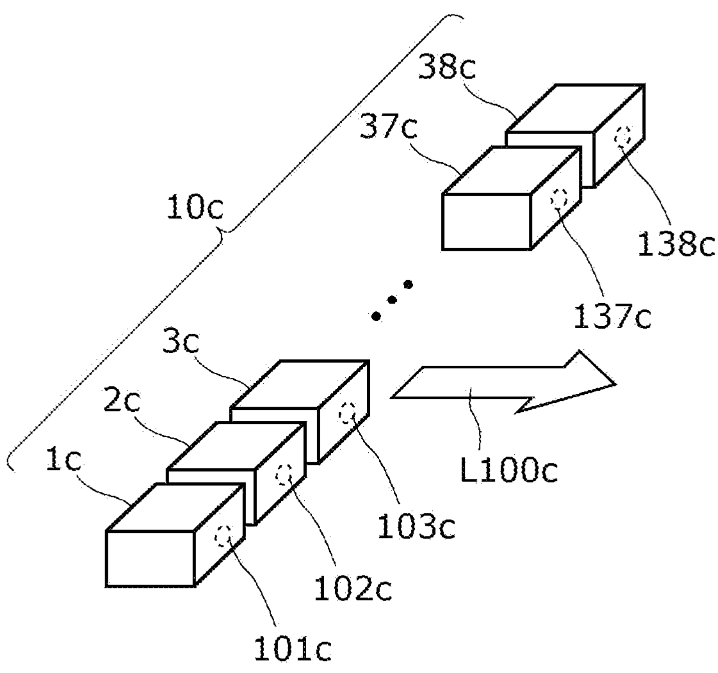
FIG. 6 is a perspective view illustrating the configuration of a plurality of laser elements included in a laser light source device according to Embodiment 3.

Next, a laser light source device according to Embodiment 3 will be described with reference to FIG. 6. FIG. 6 is a perspective view illustrating the configuration of a plurality of laser elements 10*c* included in the laser light source device according to the present embodiment.

The present embodiment differs from Embodiment 1 and Embodiment 2 in that each of the plurality of laser elements 10*c* includes a single light emitter.

Specifically, the laser light source device according to the present embodiment has the same configuration as the laser light source device according to Embodiment 1 and Embodiment 2, except that the plurality of laser elements 10*c* are provided and each of the plurality of laser elements 10*c* includes a single light emitter.

In the present embodiment, the plurality of laser elements 10*c* are composed of first laser element 1*c* to thirty-eighth laser element 38*c*. First laser element 1*c* to thirty-eighth laser element 38*c* include first light emitter 101*c* to thirty-eighth light emitter 138*c*, respectively. Specifically, each of the plurality of laser elements 10*c* according to the present embodiment is a laser chip that has a single-emitter structure. Furthermore, each of the plurality of light emitters (first light emitter 101*c* to thirty-eighth light emitter 138*c*) emits a laser beam. Here, laser beams emitted from the plurality of light emitters are comprehensively referred to as a plurality of laser beams L100*c*.

In the present embodiment as well, the reflectance of a partially reflecting mirror has a wavelength-dependency that equalizes the optical feedback efficiency of the plurality of light emitters (i.e., first light emitter 101*c* to thirty-eighth light emitter 138*c*). In this case as well, a laser light source device in which the plurality of light emitters have the same optical feedback efficiency is realized, and decrease in the oscillation stability of the plurality of laser beams L100*c* is suppressed.

Furthermore, in the present embodiment, laser light source device includes the plurality of laser elements 10*c*. The plurality of laser elements 10*c* include, for example, first laser element 1*c* including first light emitter 101*c* and second laser element 2*c* including second light emitter 102*c*.

Accordingly, in the laser light source device that includes the plurality of laser elements 10*c* each having a single-emitter structure, the plurality of light emitters can be made to have the same optical feedback efficiency.

Other Embodiments

Although the laser light source device and the laser processing apparatus according to the present disclosure have been described thus far based on the above-described embodiments, the present disclosure is not limited to the above-described embodiments.

Furthermore, although the waveguide in the laser element has a ridge-stripe structure in the above-described embodiments, the waveguide is not limited to this. For example, the waveguide may have an electrode-stripe structure configured of only a divided electrode without forming a ridge-stripe or may have a current constriction structure using a current-blocking layer.

Furthermore, although a case where a nitride-based semiconductor material is used for the laser element according to the above-described embodiments has been exemplified, the material is not limited to this. For example, the present disclosure can also be applied to a case where a semiconductor material other than a nitride-based semiconductor material is used. In such a case, the laser element includes a semiconductor laser layer structure using another semiconductor material instead of a nitride-based semiconductor laser layer structure.

Additionally, forms obtained by various modifications to the embodiments conceivable by those skilled in the art as well as forms resulting from arbitrary combinations of constituent elements and functions in the embodiments which do not depart from the essence of the present disclosure are intended to be included within the scope of the present disclosure.

INDUSTRIAL APPLICABILITY

The laser light source device and the laser processing apparatus of the present disclosure are useful as, for example, industrial machinery used for processing such as welding or cutting.

The invention claimed is:

1. A laser light source device comprising:

a first light emitter that emits a first laser beam;

a second light emitter that emits a second laser beam;

an optical element that converges the first laser beam and the second laser beam;

a wavelength dispersing element on which the first laser beam and the second laser beam that have exited from the optical element are incident, the wavelength dispersing element causing an optical axis of the first laser beam and an optical axis of the second laser beam to coincide with one another, and then transmitting the first laser beam and the second laser beam; and a partially reflecting mirror that returns a portion of the first laser beam and a portion of the second laser beam that have exited from the wavelength dispersing element by reflection, and transmits a remaining portion of the first laser beam and a remaining portion of the second laser beam that have exited from the wavelength dispersing element, wherein a reflectance of the partially reflecting mirror is wavelength-dependent, and the reflectance has a wavelength-dependency that equalizes optical feedback efficiency of the first light emitter and of the second light emitter.

2. The laser light source device according to claim 1, wherein the wavelength dispersing element is a diffraction grating.

3. The laser light source device according to claim 1, further comprising:

a laser element that includes the first light emitter and the second light emitter.

4. The laser light source device according to claim 1, further comprising:

a first laser element that includes the first light emitter; and a second laser element that includes the second light emitter.

5. A laser processing apparatus comprising:

the laser light source device according to claim 1.

6. A laser light source device comprising:

a first light emitter that emits a first laser beam;

a second light emitter that emits a second laser beam;

an optical element that converges the first laser beam and the second laser beam;

a wavelength dispersing element on which the first laser beam and the second laser beam that have exited from the optical element are incident, the wavelength dispersing element causing an optical axis of the first laser beam and an optical axis of the second laser beam to coincide with one another, and then transmitting the first laser beam and the second laser beam; and a partially reflecting mirror that returns a portion of the first laser beam and a portion of the second laser beam that have exited from the wavelength dispersing element by reflection, and transmits a remaining portion of the first laser beam and a remaining portion of the second laser beam that have exited from the wavelength dispersing element, wherein a reflectance of the partially reflecting mirror is wavelength-dependent, and when optical feedback efficiency of one of the first light emitter or the second light emitter is lower than optical feedback efficiency of an other of the first light emitter or the second light emitter, a reflectance of the partially reflecting mirror for a wavelength range of the laser beam emitted from the one of the first light emitter or the second light emitter is higher than a reflectance of the partially reflecting mirror for a wavelength range of the laser beam emitted from the other of the first light emitter or the second light emitter.

* * * * *